(12) United States Patent
Jo et al.

(10) Patent No.: US 12,411,054 B2
(45) Date of Patent: Sep. 9, 2025

(54) ELECTRONIC DEVICE INCLUDING BAROMETRIC PRESSURE SENSOR

(71) Applicant: SAMSUNG ELECTRONICS CO., LTD., Suwon-si (KR)

(72) Inventors: Jeonggyu Jo, Suwon-si (KR); Yonghwa Kim, Suwon-si (KR); Junghoon Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 212 days.

(21) Appl. No.: 17/929,239

(22) Filed: Sep. 1, 2022

(65) Prior Publication Data

US 2022/0412832 A1 Dec. 29, 2022

Related U.S. Application Data

(63) Continuation of application No. PCT/KR2022/002586, filed on Feb. 22, 2022.

(30) Foreign Application Priority Data

Feb. 22, 2021 (KR) .................. 10-2021-0023467

(51) Int. Cl.
*G01L 19/14* (2006.01)
*G01L 9/00* (2006.01)
(Continued)

(52) U.S. Cl.
CPC .......... *G01L 19/147* (2013.01); *G01L 9/0091* (2013.01); *H04M 1/026* (2013.01); *H05K 5/0213* (2013.01); *H05K 5/06* (2013.01)

(58) Field of Classification Search
CPC ... G01L 19/147; G01L 9/0091; H05K 5/0213; H05K 5/06
(Continued)

(56) References Cited

U.S. PATENT DOCUMENTS 9,462,095 B2 10/2016 Midori
10,132,706 B2 11/2018 Perkins et al.
(Continued)

FOREIGN PATENT DOCUMENTS

KR 10-2014-0089768 A 7/2014
KR 10-2018-0024632 A 3/2018
(Continued)

OTHER PUBLICATIONS

Supplementary European Search Report dated Apr. 2, 2024, in connection with European Patent Application No. EP22756605.6, 9 pages.
(Continued)

*Primary Examiner* — Peter J Macchiarolo
*Assistant Examiner* — Rodney T Frank

(57) ABSTRACT

An electronic device according to various embodiments of the disclosure includes a front plate configured to form at least a part of a front surface of the electronic device, a speaker disposed in the electronic device, a barometric pressure sensor disposed in the electronic device to measure barometric pressure, a housing configured to form a side surface of the electronic device, and a first slit provided as a gap having a first interval between the housing and an edge portion of the front plate, wherein the housing includes a sound output hole provided at a position at which the speaker is disposed, and a through-hole provided at a position at which the barometric pressure sensor is disposed, and the housing is spaced apart from the front plate to provide a duct configured to connect the through-hole and a sound output passage which is a space for connecting the first slit and the sound output hole. In addition, various other embodiments identified through the specification are possible.

20 Claims, 7 Drawing Sheets

(51) Int. Cl.
*H04M 1/02* (2006.01)
*H05K 5/02* (2006.01)
*H05K 5/06* (2006.01)

(58) Field of Classification Search
USPC .......................................................... 73/384
See application file for complete search history.

(56) References Cited

U.S. PATENT DOCUMENTS

| | | | |
|---|---|---|---|
| 10,215,742 | B2 | 2/2019 | Choi et al. |
| 10,466,047 | B2 | 11/2019 | Ehman et al. |
| 10,684,656 | B2 | 6/2020 | MacNeil et al. |
| 10,852,770 | B2 | 12/2020 | Ichikawa et al. |
| 11,333,566 | B2 | 5/2022 | Nyland et al. |
| 11,432,087 | B2 | 8/2022 | Kim et al. |
| 2014/0193018 | A1 | 7/2014 | Lim et al. |
| 2015/0219608 | A1 | 8/2015 | Choi et al. |
| 2019/0170716 | A1* | 6/2019 | Sim .................. H04M 1/03 |
| 2020/0080775 | A1 | 3/2020 | Argyres et al. |
| 2020/0177979 | A1 | 6/2020 | Cho et al. |
| 2020/0209094 | A1 | 7/2020 | Park et al. |
| 2021/0006876 | A1 | 1/2021 | Moon et al. |
| 2021/0352817 | A1 | 11/2021 | Park et al. |
| 2022/0029206 | A1 | 1/2022 | Lee et al. |

FOREIGN PATENT DOCUMENTS

| | | |
|---|---|---|
| KR | 10-2019-0038193 A | 4/2019 |
| KR | 20190066474 A | 6/2019 |
| KR | 10-2019-0088744 A | 7/2019 |
| KR | 10-2161546 B1 | 10/2020 |
| KR | 10-2021-0003538 A | 1/2021 |

OTHER PUBLICATIONS

International Search Report and Written Opinion of the International Searching Authority dated Jun. 21, 2022, in connection with International Application No. PCT/KR2022/002586, 9 pages.

Office Action issued May 12, 2025, in connection with Korean Patent Application No. 10-2021-0023467, 19 pages.

* cited by examiner

ELECTRONIC DEVICE INCLUDING BAROMETRIC PRESSURE SENSOR

CROSS-REFERENCE TO RELATED APPLICATIONS

This application is a bypass continuation of International Application No. PCT/KR2022/002586, which was filed on Feb. 22, 2022, and which claims priority to Korean Patent Application No. 10-2021-0023467, filed on Feb. 22, 2021, in the Korean Intellectual Property Office, the disclosures of which are incorporated by reference herein in their entirety.

BACKGROUND

1. Field

Various embodiments of the disclosure relate to an electronic device including a barometric pressure sensor.

2. Description of Related Art

Portable electronic devices are frequently carried during user activities. Recent portable electronic devices may provide users with various functions based on the user activities (for example, hiking, running, and cycling). For example, a portable electronic device may use a barometric pressure sensor mounted therein so as to sense an altitude change in response to the user activity, and may provide information regarding the amount of the user activity (calorie consumption) based thereon. An electronic device having a barometric pressure sensor may include a hole for transferring the barometric pressure of external air to the barometric pressure sensor such that the barometric pressure sensor can measure the barometric pressure.

SUMMARY

A barometric pressure sensor may measure the barometric pressure through efficient inflow of external air. If an electronic device including a barometric pressure sensor includes a hole formed on the outside of the electronic device to transfer the barometric pressure of external air to the barometric pressure sensor, a problem of degraded aesthetic appeal of the electronic device may occur.

Moreover, if a hole for the barometric pressure sensor and an air vent hole through which air can move from inside the electronic device to the outside thereof are used in a shared manner, the waterproof performance of the electronic device may be degraded.

Various embodiments disclosed herein may provide an electronic device including a barometric pressure sensor, which is capable of preventing an external hole of the electronic device from increasing and improving the waterproof performance of the electronic device.

An electronic device according to various embodiments of the disclosure may include a housing including a front plate and a side wall, the front plate is configured to form at least a part of a front surface of the electronic device, and the side wall is configured to form a side surface of the electronic device, a speaker disposed in the housing, a barometric pressure sensor disposed in the housing and configured to measure barometric pressure, and a first slit provided as a gap having a first interval between the side wall and an edge portion of the front plate, wherein the side wall further includes a sound output hole provided at a position at which the speaker is disposed, and a through-hole provided at a position at which the barometric pressure sensor is disposed, and the side wall is spaced apart from the front plate to provide a duct configured to connect the through-hole and a sound output passage which is a space configured to connect the first slit and the sound output hole.

An electronic device according to various embodiments of the disclosure may include a housing including a front plate and a side wall, the front plate is configured to form at least a part of a front surface of the electronic device and the side wall is configured to form a side surface of the electronic device, a speaker disposed in the housing, a barometric pressure sensor disposed in the housing and configured to measure barometric pressure, a first slit provided as a gap having a first interval between the side wall and an edge portion of the front plate, and a first duct configured to connect the first slit and the speaker, wherein the first duct includes a second duct connected to the first duct, and the second duct includes a through-hole provided to allow air introduced from the first slit to be introduced to the barometric pressure sensor.

Based on the above discussion, according to an embodiment of the disclosure, barometric pressure of external air necessary for a barometric pressure sensor may be transferred to the barometric pressure sensor through a speaker hole, and a hole for the barometric pressure sensor may be formed inside the electronic device, thereby reducing the number of holes formed on the outside of the electronic device.

Furthermore, various embodiments of the disclosure may provide an electronic device including a barometric pressure sensor, wherein an air vent hole through which air can move from inside the electronic device to the outside is formed separately from a hole for the barometric pressure sensor, thereby improving the waterproof performance of the electronic device.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1:
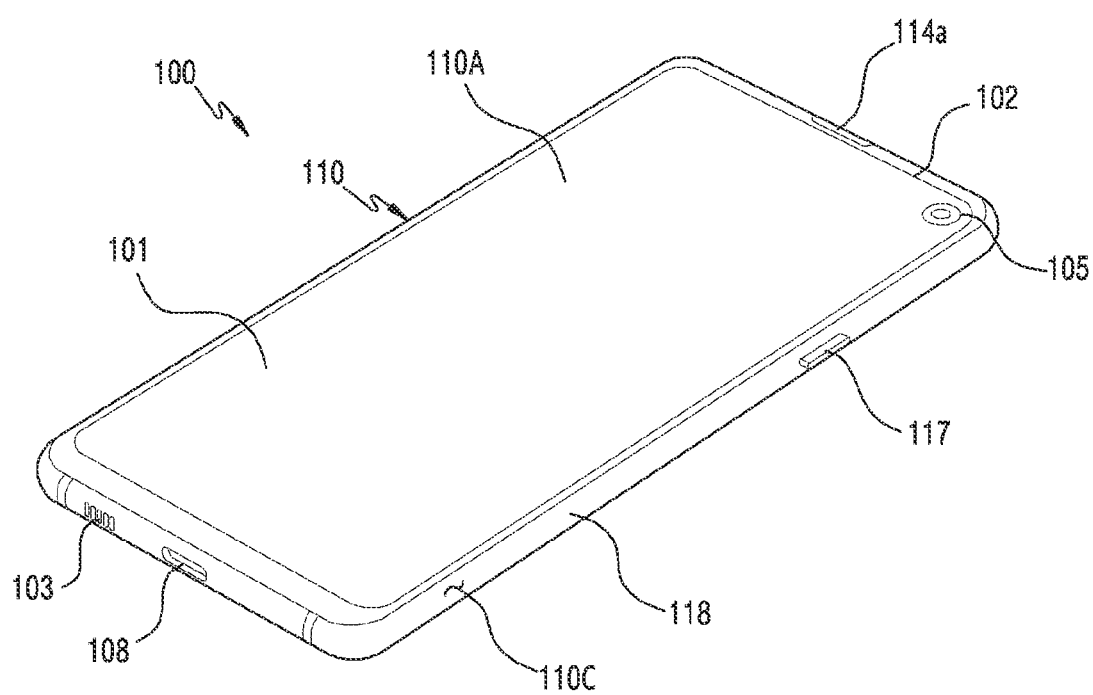
FIG. 1 is a perspective view illustrating an electronic device according to one of various embodiments disclosed herein.

FIGS. 1 through 7, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Hereinafter, various embodiments of the disclosure will be described with reference to the accompanying drawings. However, it should be appreciated that they are not intended to limit the disclosure to particular embodiments and include various modifications, equivalents, and/or alternatives for the embodiments of the disclosure. With regard to the description of the drawings, similar reference numerals may be used to designate similar elements.

An electronic device according to various embodiments of the disclosure may include at least one of, for example, a smartphone, a tablet personal computer (PC), a mobile phone, a video phone, an electronic book reader (e-book reader), a desktop PC, a laptop PC, a netbook computer, a workstation, a server, a personal digital assistant (PDA), a portable multimedia player (PMP), a MPEG-1 audio layer-3 (MP3) player, a mobile medical device, a camera, and a wearable device. The wearable device may include at least one of an accessory type (e.g., watch, ring, bracelet, anklet, necklace, glasses, contact lens, or head-mounted device (HMD)), a fabric or clothing-integrated type (e.g., electronic clothing), a body-mounted type (e.g., skin pad, or tattoo), and a bio-implantable type (e.g., implantable circuit).

In some embodiments, the electronic device may include at least one of, for example, a television, a digital video disk (DVD) player, an audio, a refrigerator, an air conditioner, a vacuum cleaner, an oven, a microwave oven, a washing machine, an air purifier, a set-top box, a home automation control panel, a security control panel, a TV box, a game console, an electronic dictionary, an electronic key, a camcorder, and an electronic photo frame.

In other embodiments, the electronic device may include at least one of various medical devices (e.g., various portable medical measuring devices (blood glucose monitoring device, heart rate monitoring device, blood pressure measuring device, body temperature measuring device, etc.), magnetic resonance angiography (MRA), magnetic resonance imaging (MRI), computed tomography (CT) machine, ultrasonic machine, etc.), a navigation device, a global positioning system (GPS) receiver, an event data recorder (EDR), a flight data recorder (FDR), a vehicle infotainment device, electronic equipment for a ship (e.g., ship navigation device, gyro-compass, etc.), avionics, a security device, an automobile head unit, a home or industrial robot, an automatic teller's machine (ATM) in banks, point of sales (POS) in a shop, or Internet of things devices (e.g., light bulb, various sensors, electric or gas meter, sprinkler device, fire alarm, thermostat, streetlamp, toaster, sporting goods, hot water tank, heater, boiler, etc.).

According to some embodiments, the electronic device may include at least one of a part of furniture or a building/structure, an electronic board, an electronic signature receiving device, a projector, and various kinds of measuring instruments (e.g., water meter, electric meter, gas meter, radio wave meter, etc.). In various embodiments, the electronic device may be one of the aforementioned various devices or a combination of one or more of the aforementioned various devices. In some embodiments, the electronic device may be a flexible electronic device. Further, the electronic device according to embodiments of the disclosure is not limited to the aforementioned devices, and may include a new electronic device according to the development of technology.

Figure 2:
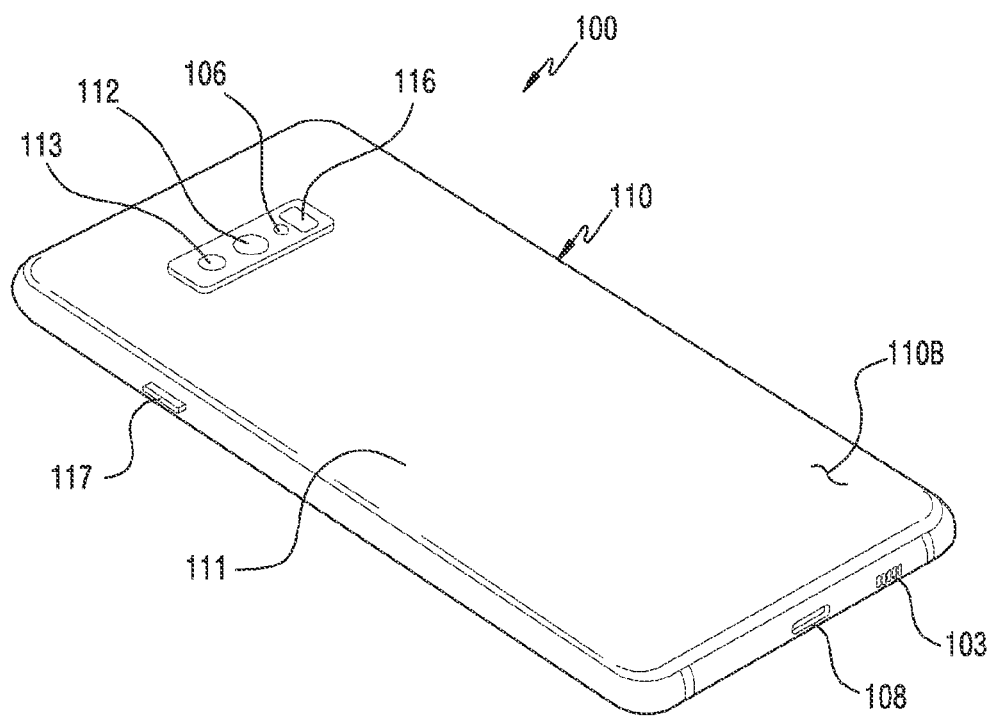
FIG. 2 is a perspective view illustrating the electronic device in FIG. 1 viewed from a rear side.

FIG. 1 is a perspective view illustrating an electronic device 100 according to various embodiments disclosed herein. FIG. 2 is a perspective view illustrating the electronic device 100 in FIG. 1 viewed from a rear side.

Referring to FIG. 1 and FIG. 2, the electronic device 100 according to an embodiment may include a housing 110 including a first surface (or a front surface) 110A, a second surface (or a rear surface) 11B, and a side surface (or a side wall) 110C surrounding a space between the first surface 110A and the second surface 1101B. In another embodiment (not illustrated, the term "housing" may refer to a structure forming a part of the first surface 110A, the second surface 110B, and the side surface 110C in FIG. 1.

According to an embodiment, at least a part of the first surface 110A may be provided by a substantially transparent front plate 102 (e.g., a glass plate or a polymer plate including various coating layers). According to an embodiment, the front plate 102 may include a curved portion extending seamlessly while being curved from the first surface 110A toward a rear plate 111 in at least one side edge portion.

According to various embodiments, the second surface 110B may be provided by a substantially opaque rear plate 111. The rear plate 111 may be made of, for example, coated or colored glass, ceramic, a polymer, or metal (e.g., aluminum, stainless steel (STS), or magnesium), or a combination of two or more of these materials. According to an embodiment, the rear plate 111 may include a curved portion extending seamlessly while being curved from the second surface 1101B towards the front plate 102 in at least one side edge portion.

According to various embodiments, the side surface 110C may be provided by a side bezel structure (or "a side member or a side wall") 118 coupled to the front plate 102 and the rear plate 111 and including metal and/or a polymer. In some embodiments, the rear plate 111 and the side bezel structure 118 may be configured in an integral structure, and may include the same material (e.g., a metal material such as aluminum).

According to an embodiment, the electronic device 100 may include at least one of a display 101, an audio module 103 and 114a, a sensor module, a camera module 105, a key input device 117, and a connector hole 108. In some embodiments, in the electronic device 100, at least one of the components (e.g., the key input devices 117) may be omitted, or other components may be additionally included. For example, the electronic device 100 may further include a sensor module (not illustrated). For example, in an area provided by the front plate 102, a sensor such as a proximity sensor or an illuminance sensor may be integrated with the display 101 or may be disposed at a position adjacent to the display 101. In some embodiments, the electronic device 100 may further include a light-emitting element, and the light-emitting element may be disposed at a position adjacent to the display 101 in the area provided by the front plate 102. For example, the light-emitting element may provide the status information of the electronic device 100 in an optical form. In another example, the light-emitting element may provide a light source which is interlocked with the operation of the camera module 105. The light-emitting element may include, for example, an LED, an IR LED, and a xenon lamp.

For example, the display 101 may be exposed through a substantial portion of the front plate 102. In some embodiments, the edge of the display 101 may be configured to have substantially the same shape as the shape of the outline (e.g., a curved surface) of the front plate 102 adjacent thereto. In another embodiment (not illustrated), the interval between the outline of the display 101 and the outline of the front plate 102 may be substantially constant in order to enlarge the area in which the display 101 is exposed. In another embodiment (not illustrated), the electronic device may have a recess or an opening provided in a portion of the screen display area of the display 101 and include another electronic component, such as the camera module 105, a proximity sensor (not illustrated), or an illuminance sensor (not illustrated) aligned with the recess or the opening provided.

In another embodiment (not illustrated), the rear surface of the screen display area of the display 101 may include at least one of the camera modules 112 and 113, a fingerprint sensor 116, and a flash 106. In another embodiment (not illustrated), the display 101 may be coupled to or disposed adjacent to a touch-sensitive circuit, a pressure sensor capable of measuring a touch intensity (pressure), and/or a digitizer configured to detect a magnetic field-type stylus pen.

The audio module 103 and 114a may include a microphone hole and a speaker hole. A microphone may be disposed in the microphone hole to acquire external sound, and in some embodiments, multiple microphones may be disposed therein to detect the direction of sound. In some embodiments, the speaker hole and the microphone hole may be implemented as a single hole 103, or a speaker (e.g., a piezo speaker) may be included without a speaker hole. The speaker hole may include an external speaker hole and a call receiver hole 114a.

The electronic device 100 may generate an electrical signal or a data value corresponding to an internal operating state or an external environmental state by including a sensor module (not illustrated). The sensor module may further include, for example, a proximity sensor disposed on the first surface 110A of the housing 110, a fingerprint sensor integrated with or disposed adjacent to the display 101, and/or a biometric sensor (e.g., an HRM sensor) disposed on the second surface 110B of the housing 110. The electronic device 100 may further include at least one of sensor modules (not illustrated), such as a gesture sensor, a gyro sensor, a barometric pressure sensor, a magnetic sensor, an acceleration sensor, a grip sensor, a color sensor, an infrared (IR) sensor, a biometric sensor, a temperature sensor, a humidity sensor, or an illuminance sensor.

The camera modules 105, 112, 113, and 106 may include a first camera device 105 disposed on the first surface 110A of the electronic device 100, second camera devices 112 and 113 disposed on the second surface 110B thereof, and/or a flash 106. The camera modules 105, 112, and 113 may include one or more lenses, an image sensor, and/or an image signal processor. The flash 106 may include, for example, a light-emitting diode or a xenon lamp. In some embodiments, two or more lenses (an infrared camera lens, a wide-angle lens, and a telephoto lens) and image sensors may be disposed on one surface of the electronic device 100.

The key input devices 117 may be disposed on the side surface 110C of the housing 110. In another embodiment, the electronic device 100 may not include some or all of the above-mentioned key input devices 117, and a key input device 117, which is not included in the above-mentioned key input devices, may be implemented in another form, such as a soft key, on the display 101. In some embodiments, the key input devices may include at least a part of a fingerprint sensor 116 disposed on the second surface 110B of the housing 110.

The connector hole 108 may accommodate a connector configured to transmit and receive power and/or data to and from an external electronic device, and/or a connector configured to transmit and receive an audio signal to and from an external electronic device. For example, the connector hole 108 may include a USB connector or an earphone jack.

Figure 3:
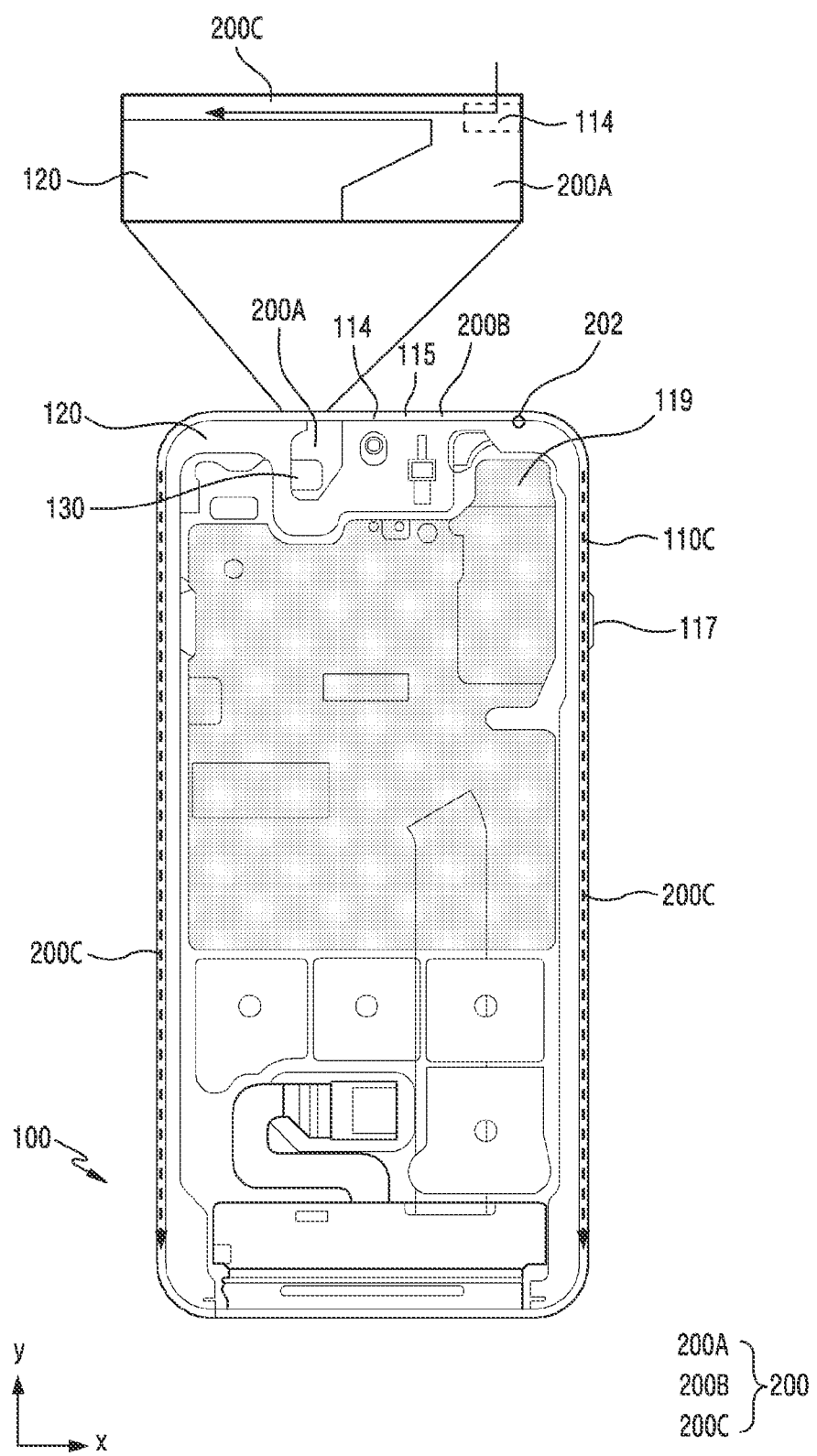
FIG. 3 is a cross-sectional view illustrating the configuration of an electronic device according to an embodiment of the present disclosure.

FIG. 3 is a cross-sectional view illustrating an internal configuration of an electronic device according to an embodiment.

Referring to FIG. 1 to FIG. 3, an electronic device 100 according to an embodiment may include a housing 110 including a first surface (or a front surface) 110A, a second surface (or a rear surface) 1101B, and a side surface (or a side wall) 110C surrounding a space between the first surface 110A and the second surface 110B. In another embodiment (not illustrated, the term "housing" may refer to a structure forming a part of the first surface 110A, the second surface 110B, and the side surface 110C in FIG. 1. According to an embodiment, the electronic device 100 may include a front plate (front 102 in FIG. 1) forming at least a part of the front surface 110A of the electronic device 100.

Referring to FIG. 3, the electronic device 100 according to an embodiment may include at least one opening opened to the outside of the electronic device 100. According to an embodiment, the at least one opening may include a first slit 114. The first slit 114 may be provided as a gap having an interval between the side wall 110C of the housing 110 and an edge portion of the front plate (front plate 102 in FIG. 1). However, the shape of the first slit 114 is not limited thereto. For example, the first slit 114 may have a shape of a hole provided in the front plate (front plate 102 in FIG. 1). The first slit 114 may have a shape of a hole provided on the side surface 110C. According to another embodiment, the first slit 114 may have a shape of an air vent hole. According to an embodiment, the first slit 114 may include a call receiver hole 114a or a speaker hole.

According to an embodiment, the electronic device 100 may further include at least one second slit 115. The at least one second slit 115 may be provided as a gap having an interval between the side wall 110C of the housing 110 and an edge of the front plate (front plate 102 in FIG. 1). The interval of the second slit 115 may be provided to be smaller than the interval of the first slit 114. For example, the interval of the first slit 114 may be provided to be an interval of about 0.3 mm. The second slit 115 may be a gap of about 0.05 mm provided along the edge portion of the front plate (front plate 102 in FIG. 1) between the housing 110 and the front plate. However, the shape of the second slit is not limited thereto. For example, the second slit 115 may have a shape of a hole provided in the front plate (front plate 102 in FIG. 1). The second slit 115 may have a shape of a hole provided on the side surface 110C. According to another embodiment, the second slit 115 may have a shape of an air vent hole.

According to an embodiment, the first slit 114 may be provide at an upper end of the electronic device 100. According to an embodiment, the second slit 115 may be provided at an upper end of the electronic device 100. However, those are not limited thereto. For example, the first slit 114 and the second slit 115 may be provided at a lower end or a side portion of the electronic device 100. According to an embodiment, the second slit 115 may be provided to extend from the first slit 114.

According to an embodiment, the electronic device 100 may include a speaker 130 and a barometric pressure sensor 119. The speaker 130 may be disposed in the electronic device. According to an embodiment, the speaker 130 may be disposed to correspond to a position at which the first slit 114 is provided. According to an embodiment, the speaker 130 may be disposed to be adjacent to the first slit 114. According to an embodiment, the barometric pressure sensor 119 may be disposed in the electronic device 100. According to an embodiment, the barometric pressure sensor 119 may be disposed to be adjacent to the first slit 114. According to an embodiment, the barometric pressure sensor 119 may be a waterproof barometric pressure sensor.

According to an embodiment, the electronic device 100 may include a duct 200. According to an embodiment, the duct 200 may include at least a part of a space provided between the front plate 102 and the side wall 110C of the housing 110. According to an embodiment, the duct 200 may be a space defined by a waterproof member 120 disposed between the front plate 102 and the side wall 110C of the housing 110 in the electronic device 100. According to another embodiment, the duct 200 may be provided to have a shape of a separate passage. According to an embodiment, the duct 200 may include at least one of a first duct 200A, a second duct 200B, or a third duct 200C. According to an embodiment, the first duct 200A may connect the first slit 114 and the speaker 130. According to an embodiment, the first duct 200A may include a sound output hole. The sound output hole may be provided to correspond to a position at which the speaker 130 is disposed. The sound output hole may be provided at the housing 110. According to an embodiment, the first duct 200A may include the second duct 200B. According to an embodiment, the second duct 200B may be provided to extend from at least one surface of the first duct 200A. According to an embodiment, the third duct 200C may be provided to extend from at least one surface of the first duct 200A. According to an embodiment, the second duct 200B may be provided along the edge portion of the housing 110. At least one of the first duct 200A, the second duct 200B, or the third duct 200C may be provided as a space surrounded by the waterproof member 120 configured to bond the housing 110, the front plate (front plate 102 in FIG. 1), and a space between the housing 110 and the front plate (front plate 102 in FIG. 1). According to an embodiment, the second duct 200B may be provided to extend from the first duct 200A in an x-axis direction. According to an embodiment, the second duct 200B may be provided at the upper end of the electronic device 100. According to an embodiment, the second duct 200B may connect the first duct 200A and the barometric pressure sensor 119. Accordingly, the barometric pressure sensor 119 may be connected to the outside via the first slit 114. As the barometric pressure sensor 119 is connected to the outside of the electronic device 100 via the passage through which the sound output from the speaker 130 is output, a separate hole for a barometric pressure sensor may not be provided at the outside of the electronic device 100.

According to an embodiment, the third duct 200C may be provided to extend from the second duct 200B. According to an embodiment, the third duct 200C may be provided to extend from the first duct 200A. However, the shapes of the first duct 200A, the second duct 200B, and the third duct 200C are not limited thereto. For example, the first duct 200A, the second duct 200B, and the third duct 200C may be provided as a single duct 200. According to an embodiment, the third duct 200C may be provided along the edge portion of the housing 110. According to an embodiment, the third duct 200C may be provided to extend along a side edge of the housing 110 in −y-axis direction.

According to an embodiment, the first slit 114 may be connected with the first duct 200A. The first slit 114 may be directly connected to the second duct 200B or the third duct 200C. According to an embodiment, the second slit 115 may be directly connected to at least one of the first duct 200A, the second duct 200B, and the third duct 200C.

According to an embodiment, the electronic device 100 may include an inner hole connected with the barometric pressure sensor 119. The inner hole may be provided to have a shape of a through-hole 202. According to an embodiment, the through-hole 202 may include at least a part of a space provided between the housing 110 and the front plate 102. According to another embodiment, the through-hole 202 may be provided at the housing 110. The through-hole 202 may be provided at a position at which the barometric pressure sensor 119 is disposed. According to an embodiment, the through-hole 202 may be spaced apart from the first slit 114. According to an embodiment, the through-hole 202 may be spaced apart from the first slit 114 in the x-axis direction.

The electronic device 100 may further include an air vent hole through which air can move from the inside to the outside of the electronic device 100 at the outside of the electronic device 100. An electronic device (not illustrated) according to a comparative embodiment may include a non-waterproof barometric pressure sensor. When the electronic device includes a non-waterproof barometric pressure sensor, a hole configured to allow barometric pressure of external air to be transmitted to the barometric pressure sensor and an air vent hole configured to allow air to move from the inside to the outside of the housing 110 may be provided as a single hole so that the barometric pressure sensor can measure the barometric pressure. However, the electronic device including the non-waterproof barometric pressure sensor may include a waterproof film for the non-waterproof barometric pressure sensor. When the waterproof film is applied, there may be a limitation in waterproof performance of the electronic device. On the other hand, the electronic device 100 according to an embodiment of the disclosure may include a waterproof barometric pressure sensor. The electronic device 100 including the waterproof barometric pressure sensor may not include the waterproof film for the barometric pressure sensor. According to an embodiment, the electronic device 100 may have a separate air vent hole (not illustrated) from the first slit 114 and the second slit 115, which is provided at the outside of the electronic device 100. According to an embodiment, the air vent hole may be provided at the housing 110.

According to an embodiment, the electronic device 100 may further include the waterproof member 120. According to an embodiment, the waterproof member 120 may be disposed to be spaced apart from the edge portion of the housing 110. According to an embodiment, the duct 200 and the through-hole 202 may be provided between the waterproof member 120 and the edge portion of the housing 110. The waterproof member 120 may block foreign substances such as water or dust introduced into the housing 110.

Figure 4:
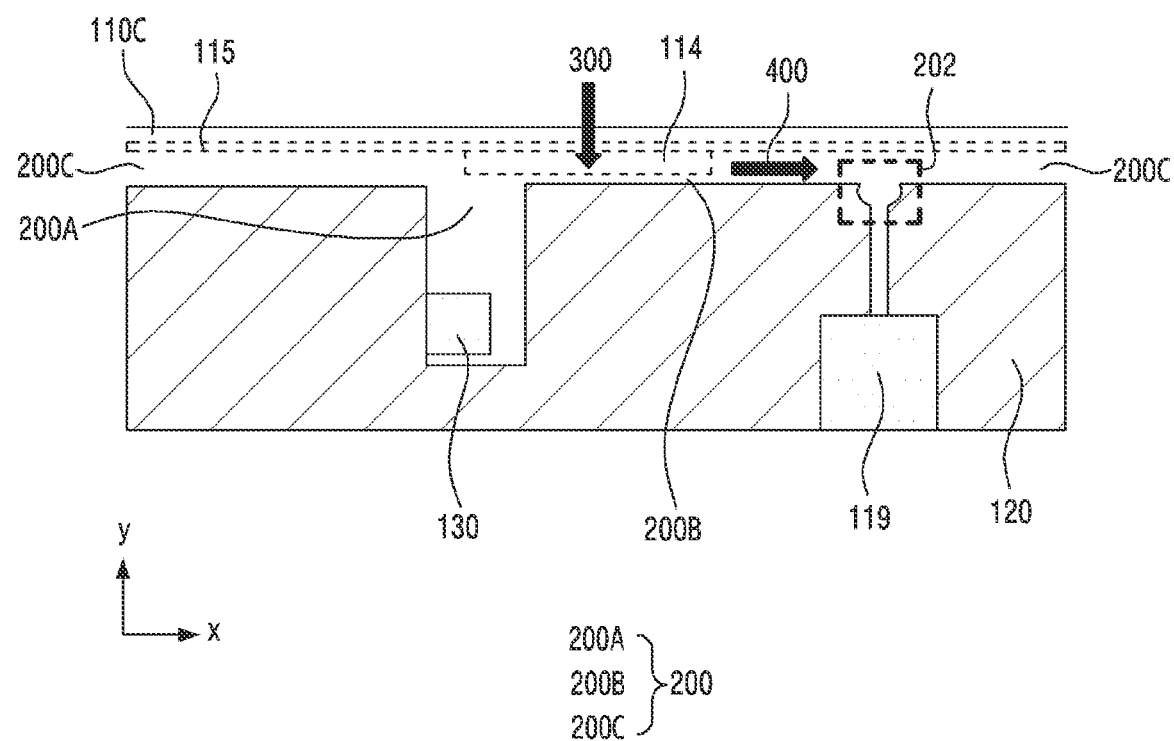
FIG. 4 is a cross-sectional view illustrating a part of the configuration of an electronic device according to an embodiment of the present disclosure.

FIG. 4 is a cross-sectional view illustrating a part of the configuration of an electronic device according to an embodiment of the present disclosure.

The configuration of the electronic device 100 may be referred to by components of the electronic device 100 in FIG. 3. The same numerals are used for the same or substantially the same components as the contents described above, and a redundant description will be omitted.

Referring to FIGS. 3 and 4, the electronic device 100 according to an embodiment may accommodate external air. According to an embodiment, the electronic device 100 may accommodate the external air via the first slit 114. According to an embodiment, the external air may be introduced in a direction 300 from the outside of the electronic device 100 toward the inside of the electronic device 100 via the first slit 114. A narrow gap through which air can pass may be provided between the side surface 110C portion of the housing and the front plate (front plate 102 in FIG. 1) in addition to the first slit 114. The gap provided between the side surface 110C portion of the housing and the front plate (front plate 102 in FIG. 1) in addition to the first slit 114 may be referred to as the second slit 115. According to an embodiment, the electronic device 100 may accommodate the external air via the second slit 115.

According to an embodiment, air introduced from the first slit 114 and/or the second slit 115 may move along the duct 200. According to an embodiment, the introduced air may move along the first duct 200A. The air moved along the first duct 200A may move along the second duct 200B. According to an embodiment, the air moved along the second duct 200B may move along the third duct 200C. The air moved along the first duct 200A may move along the third duct 200C. Air may be introduced into the through-hole 202 along the second duct 200B. According to an embodiment, the barometric pressure sensor 119 may be configured to acquire external information based on the air introduced through the through-hole 202. According to an embodiment, the electronic device 100 may include a display (display 101 in FIG. 1) or an audio module (audio module 103 and receiver hole 114a in FIG. 1). The processor may be configured to output contents related to the information via the display (display 101 in FIG. 1) or the audio module (audio module 103 and receiver hole 114a in FIG. 1) based on the information acquired by the barometric pressure sensor 119.

According to an embodiment, the electronic device 100 may further include the waterproof member 120 disposed within the housing 110. The waterproof member 120 may seal the housing 110 to prevent foreign substances such as water or dust from being introduced from the outside of the housing 110 into the housing 110. According to an embodiment, the waterproof member 120 may be disposed to be spaced apart from the edge portion of the housing 110. According to an embodiment, the waterproof member 120 may be disposed to be spaced apart from the edge portion of the side surface 110C. According to an embodiment, the duct 200 and the through-hole 202 may be provided between the edge portion of the side surface 110C and the waterproof member 120. As the waterproof member 120 is disposed to be spaced apart from the side surface 110C, the duct 200 may be provided along the edge portion of the side surface 110C.

Figure 5:
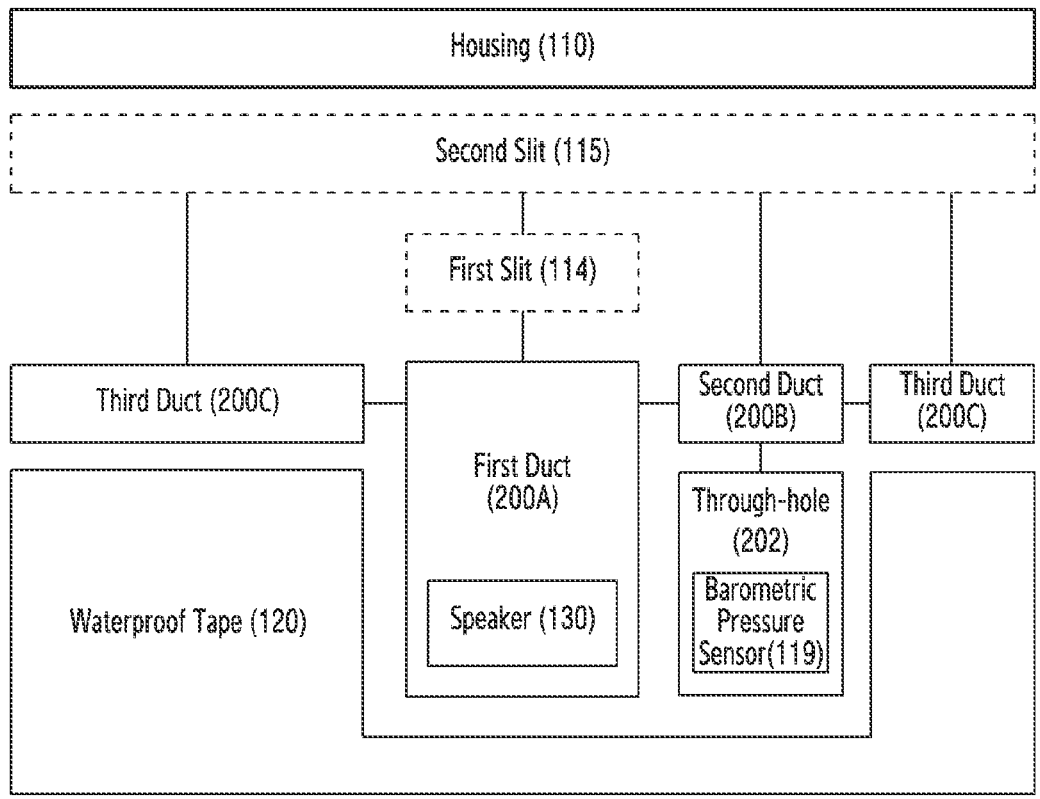
FIG. 5 is a conceptual view illustrating the configuration of an electronic device according to an embodiment of the present disclosure.

FIG. 5 is a conceptual view illustrating the configuration of an electronic device according to an embodiment of the present disclosure.

Referring to FIG. 5, the electronic device 100 may include the housing 110, the speaker 130, the barometric pressure sensor 119, and the waterproof member 120. According to an embodiment, the speaker 130, the barometric pressure sensor 119, and the waterproof member 120 may be arranged in the electronic device 100. According to an embodiment, the electronic device 100 may include the first slit 114. According to an embodiment, the electronic device 100 may further include at least one second slit 115. According to an embodiment, the first slit 114 and the at least one second slit 115 may be opened to the outside of the electronic device 100. According to an embodiment, external air may be introduced from the first slit 114 and the second slit 115 into the electronic device 100.

According to an embodiment, the first slit 114 and the second slit 115 may be provided to an outside the electronic device 100. According to an embodiment, the first slit 114 and the second slit 115 may be provided at the housing 110. According to an embodiment, the first slit 114 may include a speaker hole or a call receiver hole 114a.

According to an embodiment, the electronic device 100 may include the first duct 200A, the second duct 200B, the third duct 200C, and the through-hole 202. The first duct 200A, the second duct 200B, the third duct 200C, and the through-hole 202 may be provided in the electronic device 100. However, the configuration of the electronic device 100 is not limited thereto. For example, the electronic device 100 may exclude at least one of the components described above, or may further include at least one of other components.

According to an embodiment, the first duct 200A, the second duct 200B, and the third duct 200C may include at least a part of the space provided between the housing 110 and the front plate (front plate 102 in FIG. 1). According to an embodiment, the first duct 200A, the second duct 200B, and the third duct 200C may be a space defined by the waterproof member 120 disposed between the housing 110 and the front plate 102 in the electronic device. The first duct 200A, the second duct 200B, and the third duct 200C may have separate passage shapes and may be provided at the housing 110.

According to an embodiment, the first duct 200A may include the second duct 200B. According to an embodiment, the second duct 200B may be provided to extend from the first duct 200A. According to an embodiment, the third duct 200C may be provided to extend from the second duct 200B. According to an embodiment, the first duct 200A may include the third duct 200C. According to an embodiment, the third duct 200C may be provided to extend from the first duct 200A. The third duct 200C provided to extend from the second duct 200B may be connected to the first duct 200A along the edge portion of the housing 110. According to an embodiment, the first duct 200A, the second duct 200B, and the third duct 200C may be provided as one duct 200.

According to an embodiment, the second duct 200B may include the through-hole 202 communicating with the barometric pressure sensor 119. According to an embodiment, the through-hole 202 may be spaced apart from the first slit 114. According to an embodiment, the barometric pressure sensor 119 may be disposed adjacent to the through-hole 202. According to an embodiment, the barometric pressure sensor 119 may be disposed adjacent to the speaker 130.

According to an embodiment, the first slit 114 may be connected to the first duct 200A. The first duct 200A may connect the first slit 114 and the speaker 130. According to an embodiment, the second slit 115 may be connected with the second duct 200B. According to an embodiment, the second slit 115 may be connected with the first duct 200A and the third duct 200C. According to an embodiment, the first duct 200A, the second duct 200B, the third duct 200C, and the through-hole 202 may be arranged between the housing 110 and the waterproof member 120. According to an embodiment, the waterproof member 120 may be provided to be disposed along the first duct 200A, the second duct 200B, the third duct 200C, and the through-hole 202.

According to an embodiment, the electronic device 100 may further include a processor. The barometric pressure sensor 119 may be electrically connected with the processor. The barometric pressure sensor 119 may be configured to acquire external information based on the air introduced through the first slit 114 and the at least one second slit 115. According to an embodiment, the electronic device 100 may include a display (display 101 in FIG. 1) or an audio module (audio module 103 and receiver hole 114a in FIG. 1). The processor may be configured to output contents related to the information through the display (display 101 in FIG. 1) or the audio module (audio module 103 and receiver hole 114a in FIG. 1) based on the information acquired by the barometric pressure sensor 119.

Figure 6:
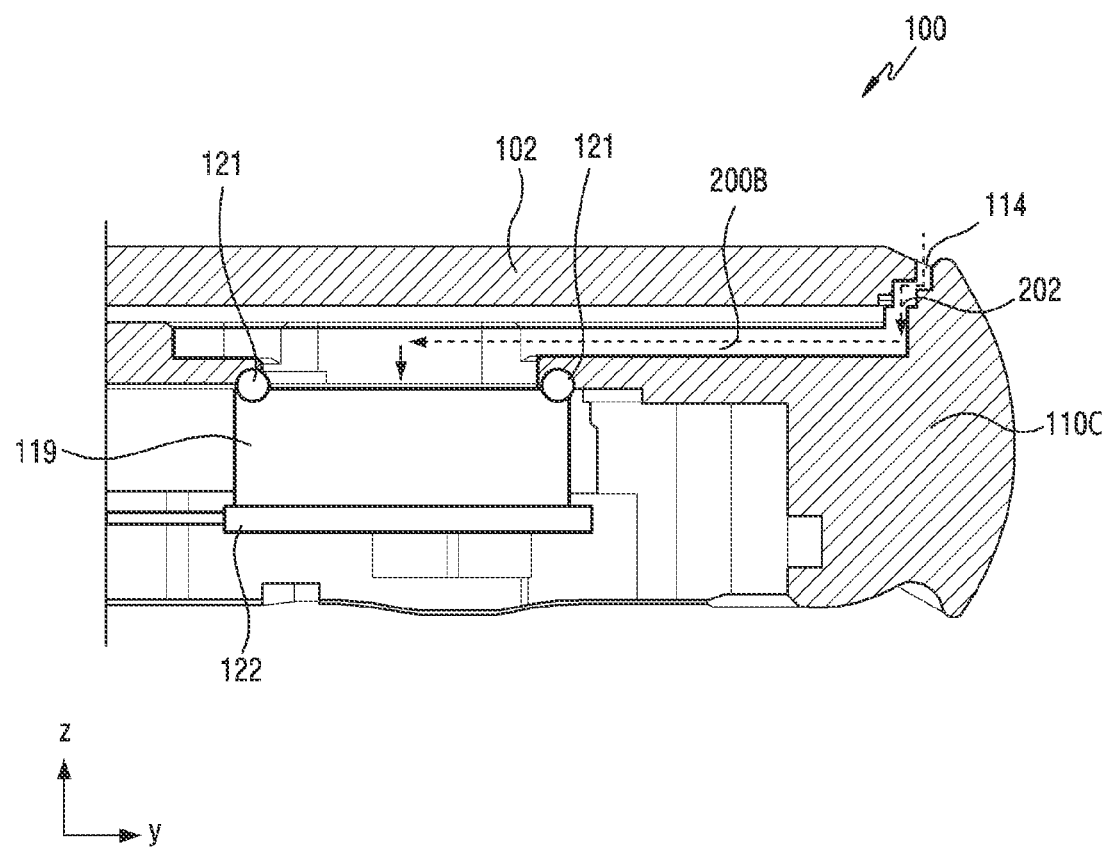
FIG. 6 is a cross-sectional view illustrating the configuration of an electronic device according to an embodiment of the present disclosure.

FIG. 6 is a cross-sectional view illustrating the configuration of an electronic device according to an embodiment of the present disclosure.

Referring to FIG. 6, external air introduced from the first slit 114 into the electronic device 100 may pass through the through-hole 202. The air passed through the through-hole 202 may move along the second duct 200B in −y-axis direction. The barometric pressure sensor 119 may acquire air moving along the second duct 200B.

According to an embodiment, the electronic device 100 may include a printed circuit board (PCB) and a main board (not illustrated). According to an embodiment, the printed circuit board (PCB) and the main board (not illustrated) may be arranged in the electronic device 100. According to an embodiment, the printed circuit board (PCB) may be a flexible PCB (FPCB) 122. According to an embodiment, as the barometric pressure sensor 119 is disposed close to the first slit 114, the electronic device 100 may include the FPCB 122 to connect the barometric pressure sensor 119 and the main board (not illustrated). According to an embodiment, the FPCB 122 may be disposed adjacent to the barometric pressure sensor 119. According to an embodiment, the FPCB 122 may face the barometric pressure sensor 119. According to an embodiment, the FPCB 122 may be electrically connected with the barometric pressure sensor 119. The FPCB 122 may be electrically connected with the main board (not illustrated).

According to an embodiment, the electronic device 100 may further include a waterproof member 121. The waterproof member 121 may be disposed between the housing 110 and the barometric pressure sensor 119. The waterproof member 121 may be disposed between the second duct 200B and the barometric pressure sensor 119. The waterproof member 121 may block foreign substances such as water or dust introduced into a space between the housing 110 or the second duct 200B and the barometric pressure sensor 119. According to an embodiment, the waterproof member 121 may include a shape of an O-ring. However, the shape of the waterproof member 121 is not limited thereto. According to an embodiment, the waterproof member 121 may include a material for sealing a gap between the barometric pressure sensor 119 and the housing 110C to block foreign substances such as water or dust. For example, the waterproof member 121 may include an O-ring made of a rubber or silicone material. However, the material of the waterproof member 121 is not limited thereto. For example, the waterproof member 121 may be made of a material for allowing inflow/outflow of air but restricting inflow/outflow of water or moisture. According to another embodiment, the waterproof member 121 may be made of a material for restricting not only inflow/outflow of air but also inflow/outflow water or humidity.

Figure 7:
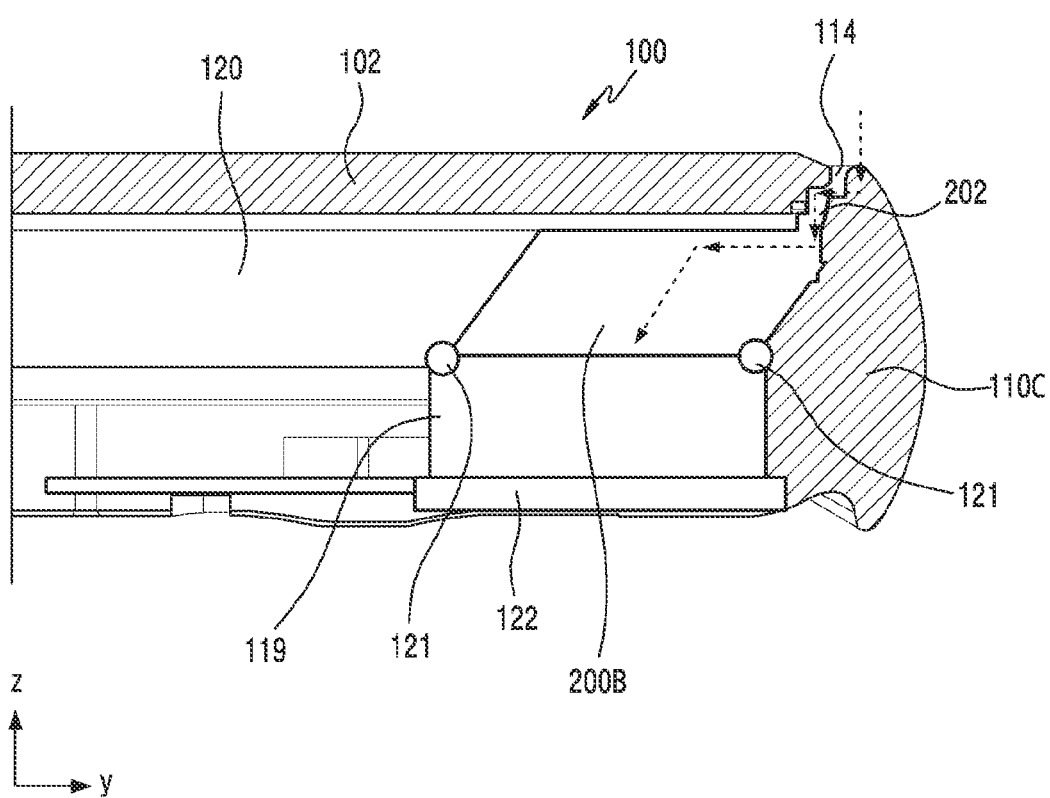
FIG. 7 is a cross-sectional view illustrating the configuration of an electronic device according to an embodiment of the present disclosure.

FIG. 7 is a cross-sectional view illustrating the configuration of an electronic device according to an embodiment of the present disclosure.

The configuration of the electronic device 100 may be referred to by components of the electronic device 100 of FIG. 1 to FIG. 7. The same numerals are used for the same or substantially the same components as the contents described above, and a redundant description will be omitted.

Referring to FIG. 7, at least a part of the duct 200 may include an inclined surface. According to an embodiment, at least a part of the second duct 200B configured to connect the through-hole 202 and the barometric pressure sensor 119 may include an inclined surface. The inclined surface may be provided to form an inclination angle with one surface of the front plate 102. The inclined surface may include at least a part of a space provided between the front plate 102 and the housing 110. According to an embodiment, the inclined surface may be a space defined by the waterproof member 120 disposed between the front plate 102 and the housing 110 in the electronic device, but is not limited thereto. For example, the duct including the inclined surface may be provided as a separate passage.

According to an embodiment, water may be introduced from the outside of the electronic device 100 into the electronic device 100. According to an embodiment, water may be introduced to the first slit 114 and/or the second slit 115. The introduced water may move along the duct 200. The inclined surface according to an embodiment may help water moving along the duct 200 to be discharged to the outside of the electronic device 100.

The various embodiments of the disclosure disclosed in the specification and drawings are merely provided as specific examples to easily explain the technical content of the disclosure and help the understanding of the disclosure, and are not intended to limit the scope of the disclosure. Therefore, the scope of the disclosure should be construed that all changes or modified forms derived based on the technical idea of the disclosure in addition to the embodiments disclosed herein are included in the scope of the disclosure.

As described above, an electronic device (e.g., the electronic device 100 in FIG. 1) according to an embodiment may include a housing with a front plate and a side wall, the front plate can be configured to form at least a part of a front surface of the electronic device, and a side wall can be configured to form a side surface of the electronic device, a speaker disposed in the housing, a barometric pressure sensor disposed in the housing and configured to measure barometric pressure, and a first slit provided as a gap having a first interval between the side wall and an edge portion of the front plate, wherein the housing includes a sound output hole provided at a position at which the speaker is disposed and a through-hole provided at a position at which the barometric pressure sensor is disposed, and wherein the side wall is spaced apart from the front plate to provide a duct configured to connect the through-hole and a sound output passage which is a space for connecting the first slit and the sound output hole.

According to an embodiment, the electronic device may further include a second slit provided as at least one gap having a second interval between the side wall and an edge portion of the front plate, and the second slit may be connected to the duct.

According to an embodiment, the electronic device may further include a waterproof member disposed in the housing, the waterproof member may be disposed to be spaced apart from the edge portion of the side wall, and the duct and the through-hole may be provided between the edge portion of the side wall and the waterproof member.

According to an embodiment, the electronic device may further include a flexible PCB (FPCB) that may face the barometric pressure sensor.

According to an embodiment, the electronic device may further include a main board that may be electrically connected with the flexible PCB (FPCB).

According to an embodiment, the side wall may be spaced apart from the front plate to further provide another duct connected with the duct along the edge portion of the front plate.

According to an embodiment, the side wall may further include an air vent hole through which air can move from the inside to the outside of the housing.

According to an embodiment, the through-hole may be spaced apart from the first slit.

According to an embodiment, at least a part of the duct may include an inclined surface disposed to form an inclination angle with a facing surface of the front plate.

According to an embodiment, the electronic device may further include a waterproof member disposed between the barometric pressure sensor and the through-hole.

As described above, an electronic device (e.g., the electronic device 100 in FIG. 1) according to an embodiment may include a housing with a front plate and a side wall, the front plate can be configured to form at least a part of a front surface of the electronic device, and the side wall can be configured to form at least a part of a side surface of the electronic device, a speaker disposed in the housing, a barometric pressure sensor disposed in the housing and configured to measure barometric pressure, a first slit provided as a gap having a first interval between the side wall and an edge portion of the front plate, and a first duct configured to connect the first slit and the speaker, wherein the first duct includes a second duct connected to the first duct, and the second duct includes a through-hole provided to allow air introduced from the first slit to be introduced to the barometric pressure sensor.

According to an embodiment, the electronic device may further include a second slit provided as at least one gap having a second interval between the side wall and an edge of the front plate, and the second slit may be connected to the second duct.

According to an embodiment, the electronic device may further include a waterproof member disposed in the housing, the waterproof member may be disposed to be spaced apart from the edge portion of the side wall, and the second duct and the through-hole may be provided between the edge portion of the side wall and the waterproof member.

According to an embodiment, the electronic device may further include a flexible PCB (FPCB), that may face the barometric pressure sensor.

According to an embodiment, the electronic device may further include a main board that may be electrically connected with the flexible PCB (FPCB).

According to an embodiment, the electronic device may further include a third duct provided along the edge portion of the front plate, and the third duct may be connected with the second duct.

According to an embodiment, the side wall may further include an air vent hole through which air can move from the inside to the outside of the housing.

According to an embodiment, the through-hole may be spaced apart from the first slit.

According to an embodiment, at least a part of the second duct may include an inclined surface disposed to form an inclination angle with a facing surface of the front plate.

According to an embodiment, the electronic device may further include a waterproof member disposed between the barometric pressure sensor and the second duct.

Although the present disclosure has been described with various embodiments, various changes and modifications may be suggested to one skilled in the art. It is intended that the present disclosure encompass such changes and modifications as fall within the scope of the appended claims.

What is claimed is:
1. An electronic device comprising:
  a housing including:
    a front plate configured to form at least a part of a front surface of the electronic device, and
    a side wall configured to form a side surface of the electronic device;
  a speaker disposed in the housing;
  a barometric pressure sensor disposed in the housing and configured to measure barometric pressure; and a first slit provided as a gap having a first interval from the side wall to an edge portion of the front plate; and a second slit provided as at least one gap having a second interval between the side wall and an edge portion of the front plate, wherein the side wall further includes:
 a sound output hole provided at a position at which the speaker is disposed, and
 a through-hole provided at a position at which the barometric pressure sensor is disposed, wherein the side wall is spaced apart from the front plate to provide a duct configured to connect the through-hole and a sound output passage which is a space configured to connect the first slit and the sound output hole, and wherein the duct includes:
 a first duct configured to connect the first slit and the speaker, and
 a second duct that extends from the first duct and configured to connect the second slit and the barometric pressure sensor.

2. The electronic device of claim 1,
wherein the second interval defines a different distance than the first interval.

3. The electronic device of claim 1, further comprising a waterproof member disposed in the housing,
wherein the waterproof member is disposed to be spaced apart from an edge portion of the side wall, and
wherein the duct and the through-hole are provided between the edge portion of the side wall and the waterproof member.

4. The electronic device of claim 1, further comprising a flexible PCB (FPCB) that faces the barometric pressure sensor.

5. The electronic device of claim 4, further comprising a main board electrically connected to the flexible PCB (FPCB).

6. The electronic device of claim 1, wherein the side wall is spaced apart from the front plate to further provide another duct connected with the duct along the edge portion of the front plate.

7. The electronic device of claim 1, wherein the side wall further includes an air vent hole through which air can move from an inside to an outside of the housing.

8. The electronic device of claim 1, wherein the through-hole is spaced apart from the first slit.

9. The electronic device of claim 1, wherein at least a part of the duct includes an inclined surface disposed to form an inclination angle with a facing surface of the front plate.

10. The electronic device of claim 1, further comprising a waterproof member disposed between the through-hole and the barometric pressure sensor.

11. An electronic device comprising:
a housing including:
 a front plate configured to form at least a part of a front surface of the electronic device, and
 a side wall configured to form a side surface of the electronic device;
a speaker disposed in the housing;
a barometric pressure sensor disposed in the housing and configured to measure barometric pressure;
a first slit provided as a gap having a first interval from the side wall to an edge portion of the front plate;
a second slit provided as at least one gap having a second interval between the side wall and an edge portion of the front plate; and
a first duct configured to connect the first slit and the speaker,
wherein the first duct includes a second duct connected to and extending from the first duct and configured to connect the second slit and the barometric pressure sensor, and
wherein the second duct includes a through-hole provided to allow air introduced from the first slit to be introduced to the barometric pressure sensor.

12. The electronic device of claim 11, wherein the second interval defines a different distance than the first interval.

13. The electronic device of claim 11, further comprising a waterproof member disposed in the housing,
wherein the waterproof member is spaced apart from an edge portion of the side wall, and
wherein the second duct and the through-hole are provided between the edge portion of the side wall and the waterproof member.

14. The electronic device of claim 11, further comprising a flexible PCB (FPCB) that faces the barometric pressure sensor.

15. The electronic device of claim 14, further comprising a main board electrically connected to the flexible PCB (FPCB).

16. The electronic device of claim 11, further comprising a third duct provided along the edge portion of the front plate,
wherein the third duct is connected with the second duct.

17. The electronic device of claim 11, wherein the side wall further includes an air vent hole through which air can move from an inside to an outside of the housing.

18. The electronic device of claim 11, wherein the through-hole is spaced apart from the first slit.

19. The electronic device of claim 11, wherein at least a part of the second duct includes an inclined surface disposed to form an inclination angle with a facing surface of the front plate.

20. The electronic device of claim 11, further comprising a waterproof member disposed between the second duct and the barometric pressure sensor.

* * * * *